United States Patent
Zhu (10) Patent No.: US 12,133,375 B2
(45) Date of Patent: Oct. 29, 2024

(54) SEMICONDUCTOR STRUCTURES AND MANUFACTURING METHODS THEREOF

(71) Applicant: CHANGXIN MEMORY TECHNOLOGIES, INC., Anhui (CN)

(72) Inventor: Xiao Zhu, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 426 days.

(21) Appl. No.: 17/310,645

(22) PCT Filed: Mar. 8, 2021

(86) PCT No.: PCT/CN2021/079488
§ 371 (c)(1),
(2) Date: Aug. 14, 2021

(87) PCT Pub. No.: WO2021/203885
PCT Pub. Date: Oct. 14, 2021

(65) Prior Publication Data
US 2022/0320105 A1 Oct. 6, 2022

(30) Foreign Application Priority Data
Apr. 8, 2020 (CN) .......................... 202010267288.4

(51) Int. Cl.
*H10B 12/00* (2023.01)
(52) U.S. Cl.
CPC ........... *H10B 12/482* (2023.02); *H10B 12/30* (2023.02)
(58) Field of Classification Search
CPC .... H10B 12/482; H10B 12/30; H10B 12/485; H01L 21/76224
See application file for complete search history.

(56) References Cited

U.S. PATENT DOCUMENTS

| 9,293,362 B2 | 3/2016 | Leet et al. |
| 2003/0178688 A1* | 9/2003 | Yang ................. H01L 29/41766 |
| | | 257/E21.507 |

(Continued)

FOREIGN PATENT DOCUMENTS

| CN | 103903994 A | 7/2014 |
| CN | 103456694 B | 9/2017 |

(Continued)

OTHER PUBLICATIONS

International Search Report in Application No. PCT/CN2021/079488, mailed on May 27, 2021.

(Continued)

*Primary Examiner* — Thanh T Nguyen
(74) *Attorney, Agent, or Firm* — Syncoda LLC; Feng Ma (57) ABSTRACT

A method for manufacturing a semiconductor structure includes: providing a substrate and a plurality of discrete bit line structures located on the substrate, the bit line structure having a metal layer therein, a top surface of the metal layer being lower than a top surface of the bit line structure; forming a first isolation film filled between the adjacent bit line structures, a top surface of the first isolation film being higher than the top surface of the metal layer and lower than the top surface of the bit line structure; forming a first dielectric film on the top and sidewalls of the bit line structure and on the top surface of the first isolation film; and etching to remove the first dielectric film on the top of the bit line structures and the top surface of the first isolation film to form a first dielectric layer, and etching to remove the first isolation film exposed by the first dielectric layer to form a first isolation layer exactly below the first dielectric layer.

9 Claims, 5 Drawing Sheets

(56) References Cited

U.S. PATENT DOCUMENTS

| | | | | |
|---|---|---|---|---|
| 2005/0272250 A1* | 12/2005 | Yun | ............... | H10B 12/482 |
| | | | | 257/E21.507 |
| 2006/0022256 A1 | 2/2006 | Lee et al. | | |
| 2009/0081847 A1* | 3/2009 | Kubota | ............ | H10B 41/30 |
| | | | | 257/E21.546 |
| 2010/0285662 A1 | 11/2010 | Kim et al. | | |
| 2014/0175659 A1* | 6/2014 | Lee | ............... | H01L 23/48 |
| | | | | 257/773 |
| 2018/0090313 A1* | 3/2018 | Chung | ............ | H01L 21/02164 |
| 2019/0296026 A1 | 9/2019 | Ji et al. | | |

FOREIGN PATENT DOCUMENTS

| | | |
|---|---|---|
| CN | 108831884 A | 11/2018 |
| CN | 110931485 A | 3/2020 |
| CN | 110970351 A | 4/2020 |
| CN | 110970436 A | 4/2020 |
| CN | 210272309 U | 4/2020 |
| JP | H104082 A | 1/1998 |
| JP | H1126713 A | 1/1999 |
| JP | 2003347428 A | 12/2003 |
| JP | 2018056561 A | 4/2018 |

OTHER PUBLICATIONS

European Patent Office Office Action in Application No. 21773434.2, mailed on Feb. 13, 2023.
China first office action in Application No. 202010267288.4, mailed on Feb. 11, 2023.
Extended European Search Report in Application No. 21773434.2, mailed on May 23, 2022.
Notice of Reasons for Refusal in Japanese patent application No. 2022-547939, date of drafting Oct. 26, 2023.

* cited by examiner

SEMICONDUCTOR STRUCTURES AND MANUFACTURING METHODS THEREOF

CROSS-REFERENCE TO RELATED APPLICATIONS

This application is a national stage of International Application No. PCT/CN2021/079488 filed on Mar. 8, 2021, which claims priority to Chinese Patent Application No. 202010267288.4 filed on Apr. 8, 2020. The disclosures of these applications are hereby incorporated by reference in their entirety.

TECHNICAL FIELD

Embodiments of the present disclosure relate to the field of semiconductors, and in particular to a semiconductor structure and a manufacturing method thereof.

BACKGROUND

As the feature size and line width of dynamic random-access memories (DRAMs) continue to decrease, the spacing between adjacent bit line structures is getting smaller. As the spacing between adjacent bit line structures gets smaller, the parasitic capacitance between adjacent bit line structures increases, which will affect the performance of the dynamic random-access memories.

How to reduce the parasitic capacitance between adjacent bit line structures and how to reduce the manufacturing cost of the dynamic random-access memories while decreasing the parasitic capacitance are currently urgent problems to be solved.

SUMMARY

Some embodiments of the present disclosure provide a semiconductor structure and a manufacturing method thereof, which are helpful to reduce the cost of the semiconductor structure.

In order to solve the above problems, some embodiments of the present disclosure provide a method for manufacturing a semiconductor structure, comprising: providing a substrate and a plurality of discrete bit line structures located on the substrate, the bit line structure having a metal layer therein, a top surface of the metal layer being lower than a top surface of the bit line structure; forming a first isolation film filled between the adjacent bit line structures, a top surface of the first isolation film being higher than the top surface of the metal layer and lower than the top surface of the bit line structure; forming a first dielectric film on the top and sidewalls of the bit line structure and on the top surface of the first isolation film; and etching to remove the first dielectric film on the top of the bit line structures and the top surface of the first isolation film by a maskless dry etching process to form a first dielectric layer, and etching to remove the first isolation film exposed by the first dielectric layer to form a first isolation layer exactly below the first dielectric layer.

In addition, a dielectric constant of material for the first isolation layer is less than a dielectric constant of material for the first dielectric layer.

In addition, the material for the first isolation layer comprises silicon dioxide and precursor gas forming the first isolation layer comprises ethyl silicate and ozone.

In addition, the first isolation film is formed by a chemical vapor deposition process and the first dielectric film is formed by an atomic layer deposition process.

In addition, a material for the first isolation layer comprises silicon; and after forming the first isolation layer, the first isolation layer is oxidized to generate silicon dioxide.

In addition, after forming the first isolation layer, the method further comprises: forming a second dielectric layer on a sidewall of the first isolation layer exposed by the first dielectric layer, a hardness of the material for the second dielectric layer being greater than a hardness of the material for the first isolation layer.

In addition, forming the first isolation layer and the first dielectric layer comprises: forming the first dielectric layer by a first maskless dry etching process, an etching rate for the first dielectric film being greater than an etching rate for the first isolation film by the first maskless dry etching process; and forming the first isolation layer by a second maskless dry etching process, the etching rate for the first isolation film being greater than the etching rate for the first dielectric film by the second maskless dry etching process.

In addition, the first isolation film comprises first regions being located on sidewalls of the bit line structure and having a preset thickness, and a second region located between the first regions; and before the second maskless dry etching process, an ion doping process is performed on the first regions or the second region, the ion doping process being used to make the etching rate for the second region greater than the etching rate for the first regions.

In addition, the forming a first isolation film filled between the adjacent bit line structures comprises: forming an initial isolation film completely filled between the adjacent bit line structures; performing a flattening process so that a top surface of the initial isolation film is flush with the top surface of the bit line structure; and etching to remove part of a thickness of the initial isolation film to form the first isolation film.

In addition, the difference in height between the top surface of the first isolation film and the top surface of the bit line structure is 50 nm to 100 nm.

Correspondingly, some embodiments of the present disclosure further provide a semiconductor structure, comprising: a substrate and a plurality of discrete bit line structures located on the substrate, the bit line structure having a metal layer therein, a top surface of the metal layer being lower than a top surface of the bit line structure; a first isolation layer, located on sidewalls of the bit line structure, a top surface of the first isolation layer being higher than the top surface of the metal layer and lower than the top surface of the bit line structure; and a first dielectric layer, located on sidewalls of the bit line structure and exactly above the first isolation layer.

In addition, a dielectric constant of material for the first isolation layer is less than a dielectric constant of material for the first dielectric layer.

In addition, the material for the first isolation layer comprises silicon dioxide.

In addition, the semiconductor structure further comprises: a second dielectric layer located on sidewalls of the first isolation layer exposed by the first dielectric layer, a hardness of the material for the second dielectric layer being greater than a hardness of the material for the first isolation layer.

Compared with the prior art, the technical solutions in some embodiments of the present disclosure have the following advantages.

In the above technical solution, a first dielectric film is formed on the top and sidewalls of the bit line structure, and the first dielectric film is removed by a maskless dry etching process to form a first dielectric layer. The first dielectric layer can be used as a mask for etching the first isolation film. In this way, in the process of etching the first isolation film, there is no need to specially form a mask, which is helpful to reduce the manufacturing cost of the semiconductor structure.

In addition, the top surface of the first isolation layer is higher than the top surface of the metal layer, and the dielectric constant of the first isolation layer is less than the dielectric constant of the first dielectric layer. In this way, this is helpful to reduce the dielectric constant between adjacent metal layers and decrease the parasitic capacitance between the bit line structures.

In addition, the first isolation film made of silicon is formed first and then oxidized to generate silicon dioxide, which is helpful to increase the etching selectivity between the first dielectric film material and the first isolation film material and improve the etching accuracy of the etching process.

BRIEF DESCRIPTION OF THE DRAWINGS

One or more embodiments will be exemplified by pictures in the corresponding drawings. These exemplified descriptions do not constitute any limitation to the embodiments. Elements with the same reference numerals in the drawings are represented as similar elements. Unless otherwise stated, the drawings are not necessarily drawn to scale.

DETAILED DESCRIPTION

As the semiconductor structure continues to miniaturize, the spacing between adjacent bit line structures is getting smaller. Meanwhile, as the spacing is getting smaller, a small deviation in the thickness accuracy of the isolation layer will affect the isolation effect of the isolation layer, or even lead to new problems such as failure in effective isolation.

When the position of the isolation layer is determined, an area to be etched is usually determined by photoresist and photomask. However, the photomask is costly, and the higher the accuracy, the higher the cost. Both the smaller spacing and the requirements on the thickness accuracy of the isolation layer propose higher requirements on the accuracy of the photomask, leading to the increased manufacturing cost which is not beneficial to the product development and production.

In order to solve the above problems, some embodiments of the present disclosure provide a method for manufacturing a semiconductor structure, comprising: providing a substrate and a plurality of discrete bit line structures located on the substrate, the bit line structure having a metal layer therein, the top surface of the metal layer being lower than the top surface of the bit line structure; forming a first isolation film filled between the adjacent bit line structures, the top surface of the first isolation film being higher than the top surface of the metal layer and lower than the top surface of the bit line structure; forming a first dielectric film on the top and sidewalls of the bit line structure and on the top surface of the first isolation film; and etching to remove the first dielectric film on the top of the bit line structure and the top surface of the first isolation film to form a first dielectric layer, and etching to remove the first isolation film exposed by the first dielectric layer to form a first isolation layer exactly below the first dielectric layer by a maskless dry etching process.

To make the objectives, technical solutions and advantages of the embodiments of the present disclosure clearer, the embodiments of the present disclosure will be further described below in detail with reference to the accompanying drawings. However, it may be understood by a person of ordinary skill in the art that, in the embodiments of the present disclosure, many technical details are provided for the better understanding of the present disclosure. However, the technical solutions sought to be protected by the present disclosure can be implemented, even without these technical details and various changes and modifications based on the following embodiments.

FIGS. 1 to 7 are schematic cross-sectional structure diagrams corresponding to steps of the method for manufacturing a semiconductor structure according to an embodiment of the present disclosure.

Figure 1:
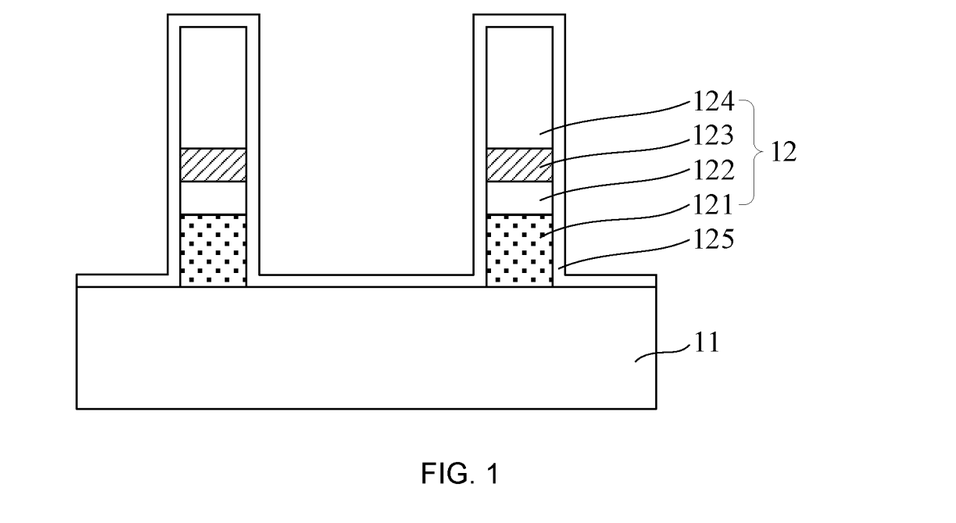
FIG. 1 is a first schematic cross-sectional structure diagrams diagram corresponding to steps a step of the method for manufacturing a semiconductor structure according to an embodiment of the present disclosure.

Referring to FIG. 1, a substrate 11 and a plurality of discrete bit line structures 12 located on the substrate 11 are provided. The bit line structure 12 has a metal layer 123 therein. The top surface of the metal layer 123 is lower than the top surface of the bit line structure 12.

The substrate 11 comprises structures such as buried word lines, shallow trench isolation structures, and active regions. The bit line structure 12 comprises a bit line contact 121, a bottom dielectric layer 122, a metal layer 123, and a top dielectric layer 124. The material for the bit line contact 121 comprises tungsten or polycrystalline silicon. The material for the bottom dielectric layer 122 and the top dielectric layer 124 comprises silicon nitride, silicon dioxide or silicon oxynitride. The metal layer 123 comprises a variety of conductive materials, such as doped polycrystalline silicon, titanium, titanium nitride, tungsten, and tungsten composites.

In this embodiment, the semiconductor structure further comprises a protective layer 125 which covers at least the surface of the metal layer 123 to prevent the metal layer 123 from being damaged.

In this embodiment, the protective layer 125 is formed by an atomic layer deposition process. The atomic layer deposition process has the characteristics of slow deposition rate, high density of the deposited film and good step coverage. In this way, the protective layer 125 can, with a small thickness, effectively isolate and protect the adjacent metal layers 123, thereby avoiding occupying the small space between the adjacent bit line structures 12, which is helpful to realize the subsequent filling of the isolation layer and improve the isolation effect between the adjacent metal layers 123.

The material for the protective layer 125 comprises silicon nitride or silicon oxynitride.

In this embodiment, forming a first isolation film filled between the adjacent bit line structures 12 comprises the following steps.

Figure 2:
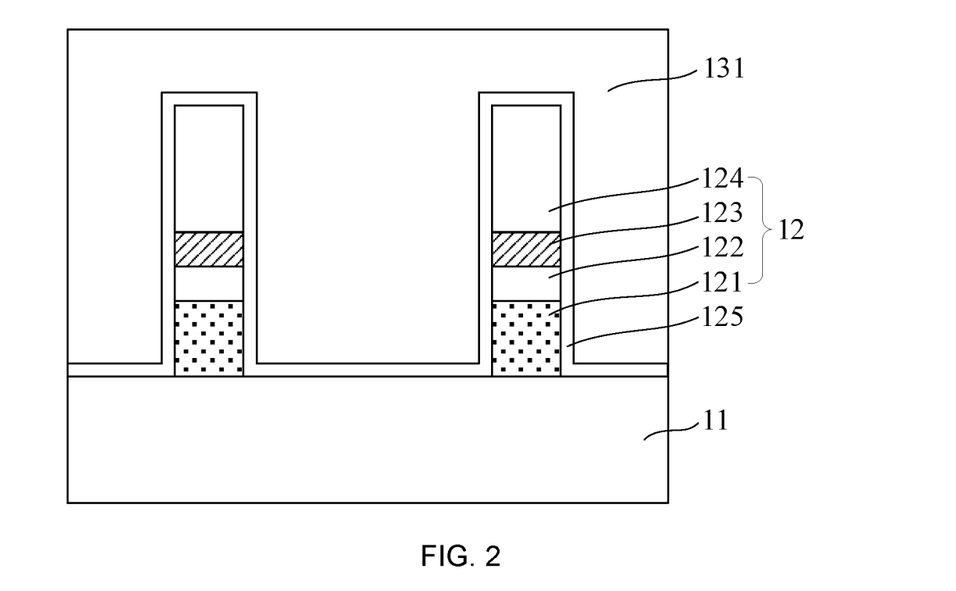
FIG. 2 is a second schematic cross-sectional structure diagram corresponding to a step of the method for manufacturing a semiconductor structure according to an embodiment of the present disclosure.

Referring to FIG. 2, an initial isolation film 131 completely filled between the adjacent bit line structures 12 is formed.

In this embodiment, the top surface of the initial isolation film 131 is higher than the top surface of the bit line structure 12. In this way, it is helpful to ensure that the initial isolation film 131 is in close contact with the metal layer 123, thereby ensuring the isolation effect of the subsequently formed first isolation layer.

It should be noted that, if the top surface of the finally formed initial isolation film 131 is slightly higher than the top surface of the metal layer 123 or is flush with the top surface of the metal layer 123, there may be an air gap between the initial isolation film 131 and the metal layer 123. When pollution occurs because other substances enter the air gap, the isolation effect between the adjacent metal layers 123 will be lower than that expected. Meanwhile, if there is an air gap, the subsequently formed first isolation layer may fail, such as, collapse etc. due to insufficient strength, which may cause the isolation effect to weaken or even eliminate.

In this embodiment, the material for the initial isolation film 131 comprises silicon dioxide. For example, ethyl silicate and ozone may be used as the precursor gas to form silicon dioxide. Since ethyl silicate is less costly, the use of ethyl silicate as the raw material to form silicon dioxide can reduce the cost of the manufacturing process.

Wherein, the process of forming silicon dioxide comprises a chemical vapor deposition process or an atomic layer deposition process. Since the top surface of the initial isolation film 131 to be formed needs to be higher than the top surface of the bit line structure 12 and the thickness is relatively large. Therefore, forming the initial isolation film 131 by the chemical vapor deposition process with a fast deposition rate is helpful to shorten the period of the manufacturing process.

Figure 3:
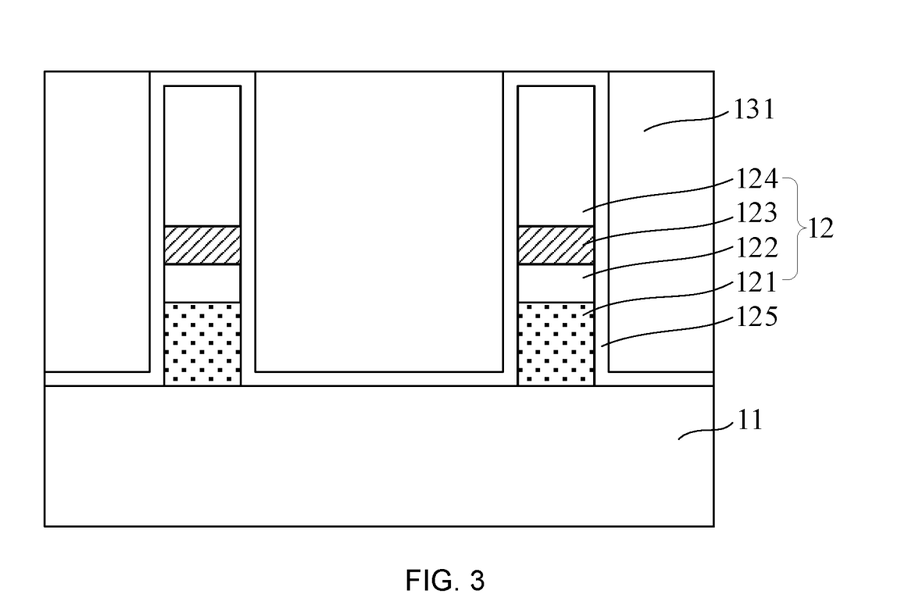
FIG. 3 is a third schematic cross-sectional structure diagram corresponding to a step of the method for manufacturing a semiconductor structure according to an embodiment of the present disclosure.

Referring to FIG. 3, a flattening process is performed so that the top surface of the initial isolation film 131 is flush with the top surface of the bit line structure 12.

In this embodiment, the initial isolation film 131 higher than the top surface of the bit line structure 12 is removed by chemical mechanical polishing. Compared with the etching process, the chemical mechanical polishing has a higher removal rate, which is helpful to shorten the process period.

Figure 4:
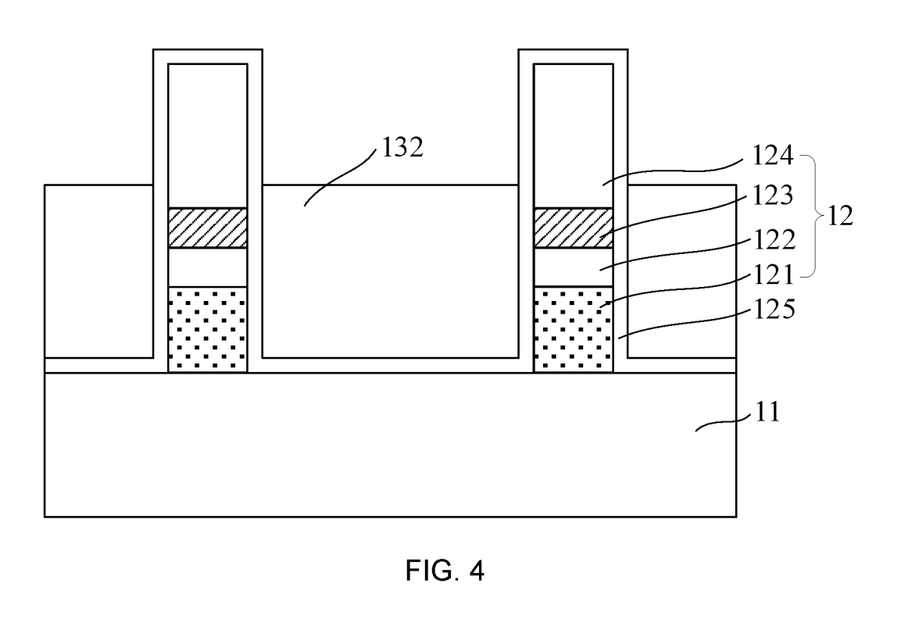
FIG. 4 is a fourth schematic cross-sectional structure diagram corresponding to a step of the method for manufacturing a semiconductor structure according to an embodiment of the present disclosure.

Referring to FIG. 4, part of the thickness of the initial isolation film is removed by etching to form a first isolation film 132.

The thickness of the initial isolation film to be removed is determined according to the difference in height between the top surface of the bit line structure 12 and the top surface of the metal layer 123, but it is necessary to ensure that the top surface of the first isolation film 132 is higher than the top surface of the metal layer 123 and lower than the top surface of the bit line structure 12 so as to ensure the isolation effect of the subsequently formed first isolation layer.

In this embodiment, the difference in height between the top surface of the first isolation film 132 and the top surface of the bit line structure 12 is 50 nm to 100 nm, for example, 60 nm, 75 nm or 90 nm.

Figure 5:
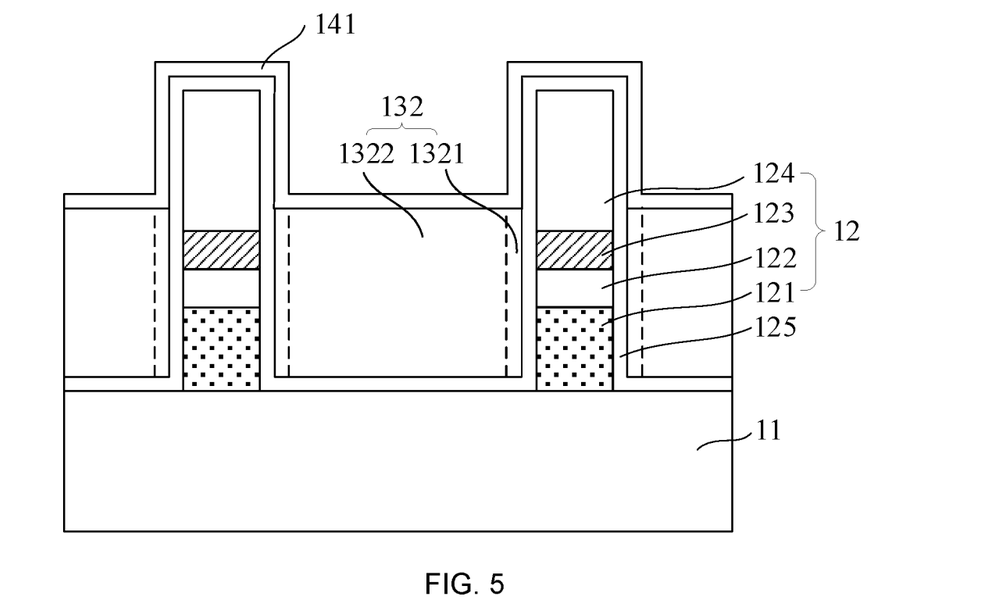
FIG. 5 is a fifth schematic cross-sectional structure diagram corresponding to a step of the method for manufacturing a semiconductor structure according to an embodiment of the present disclosure.

Referring to FIG. 5, a first dielectric film 141 is formed on the top and sidewalls of the bit line structure 12 and on the top surface of the first isolation film 132.

In this embodiment, the first dielectric film 141 is formed by an atomic layer deposition process. Since the atomic layer deposition process has the characteristics of slow deposition rate and good step coverage, forming the first dielectric film 141 by the atomic layer deposition process is helpful to ensure the thickness accuracy of the first dielectric film 141, thereby ensuring the thickness accuracy of the subsequently formed first isolation layer.

It should be noted that the thickness of the first dielectric film 141 is equal to the thickness of the first isolation layer to be formed subsequently. To be precise, the thickness of the first dielectric film 141 located on the sidewall of the protective layer 125 defines the thickness of the first isolation layer to be formed.

In this embodiment, the dielectric constant of the first dielectric film 141 is greater than the dielectric constant of the first isolation film 132, and the material for the first dielectric film 141 comprises silicon nitride or silicon oxynitride. It should be noted that the selection of the material for the first dielectric film 141 needs to meet the requirement on high etching selectivity as much as possible, that is, there is a higher etching selectivity between the material for the first dielectric film 141 and the material for the first isolation film 132. In this way, it is helpful to ensure the etching accuracy of the subsequent etching process and avoid etching non-etched objects by the etching process.

In this embodiment, the first isolation film comprises first regions 1321, being located on sidewalls of the bit line structure 12 and having a preset thickness, and a second region 1322, located between the first regions 1321; and before etching the first isolation film by the second maskless dry etching process, an ion doping process is performed on the first region 1321 or the second region 1322 so that the etching rate for the second region 1322 is greater than the etching rate for the first region 1321; wherein, the first region 1321 with a preset thickness is used to form the first isolation layer. In this way, it is helpful to improve the thickness accuracy of the first isolation layer.

Figure 6:
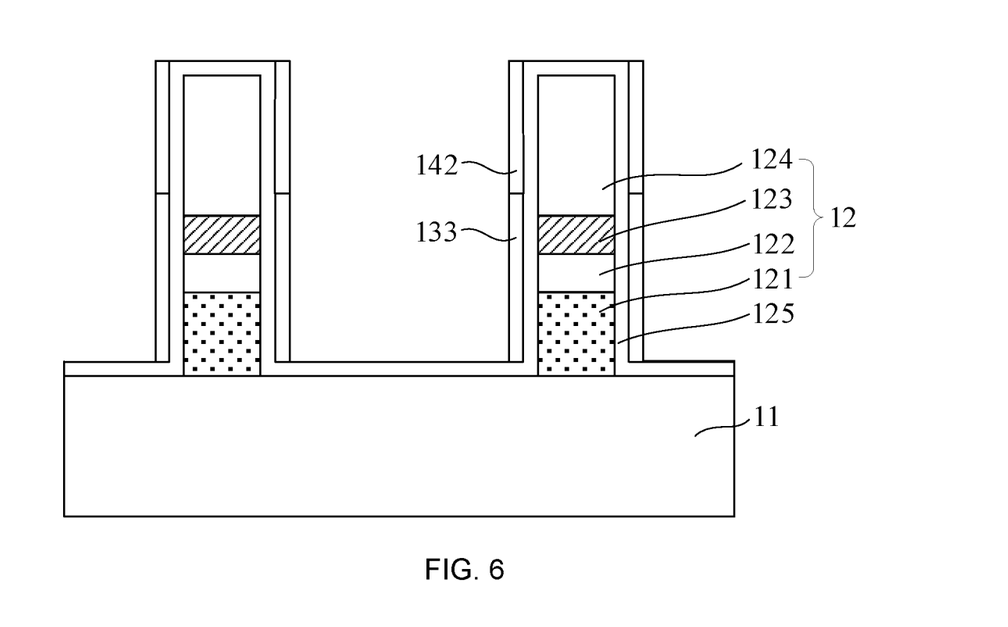
FIG. 6 is a sixth schematic cross-sectional structure diagram corresponding to a step of the method for manufacturing a semiconductor structure according to an embodiment of the present disclosure.

Referring to FIG. 6, a first dielectric layer 142 and a first isolation layer 133 are formed by a maskless dry etching process.

In this embodiment, the first dielectric film on the top of the bit line structure 12 and the top surface of the first isolation film is removed by a first maskless dry etching process to form a first dielectric layer 142; and the first isolation film exposed by the first dielectric layer 142 is removed by a second maskless dry etching process to form a first isolation layer 133 exactly below the first dielectric layer 142.

Wherein, the etching rate for the first dielectric film is greater than the etching rate for the first isolation film by the first maskless dry etching process, and the etching rate for the first isolation film is greater than the etching rate for the first dielectric film by the second maskless dry etching process. In this way, it is helpful to avoid excessive etching of the first isolation film when etching the first dielectric film, and avoid excessive etching of the first dielectric film when etching the first isolation film, thereby ensuring the etching accuracy of the etching process and thus the thickness accuracy of the first dielectric layer 142 and the first isolation layer 133.

Figure 7:
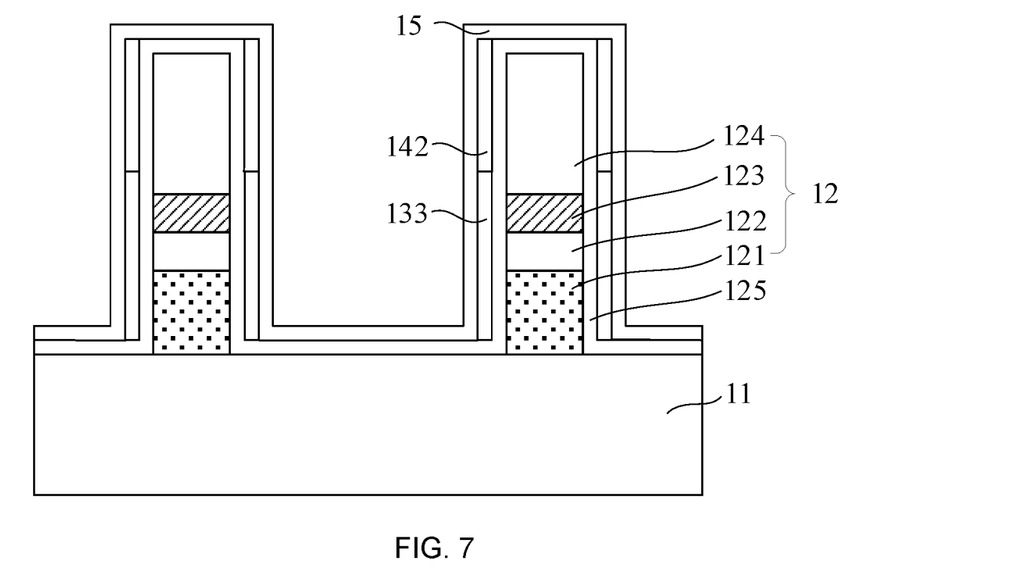
FIG. 7 is a seventh schematic cross-sectional structure diagram corresponding to a step of the method for manufacturing a semiconductor structure according to an embodiment of the present disclosure.

Referring to FIG. 7, a second dielectric layer 15 is formed.

In this embodiment, after forming the first isolation layer 133, a second dielectric layer 15 is formed on a sidewall of the first isolation layer 133 exposed by the first dielectric layer 142, the hardness of the material for the second dielectric layer 15 being greater than the hardness of the material for the first isolation layer 133. In this way, it is helpful to support the first isolation layer 133 with lower hardness, thereby avoiding the collapse of the first isolation layer 133 and further ensuring the isolation effect of the first isolation layer 133.

In this embodiment, a first dielectric film 141 is formed on the top and sidewalls of the bit line structure 12, and the first dielectric film 141 is removed by a maskless dry etching process to form a first dielectric layer 142. The first dielectric layer 142 can be used as a mask for etching the first isolation film 132. In this way, in the process of etching the first isolation film 132 to form the first isolation layer 133 with a preset thickness, there is no need to specially form a mask, which is helpful to reduce the manufacturing cost of the semiconductor structure.

Another embodiment of the present disclosure further provides a method for manufacturing a semiconductor structure. The difference from the previous embodiment is that, in this embodiment, the material for the initial isolation film is silicon. The detailed description will be given with reference to FIGS. 8 and 9, which are schematic cross-sectional structure diagrams corresponding to steps of the method for manufacturing a semiconductor structure according to another embodiment of the present disclosure. For the manufacturing steps that are the same as or corresponding to the previous method embodiments, please refer to the corresponding description of the previous method embodiments. They will not be described in detail below.

Figure 8:
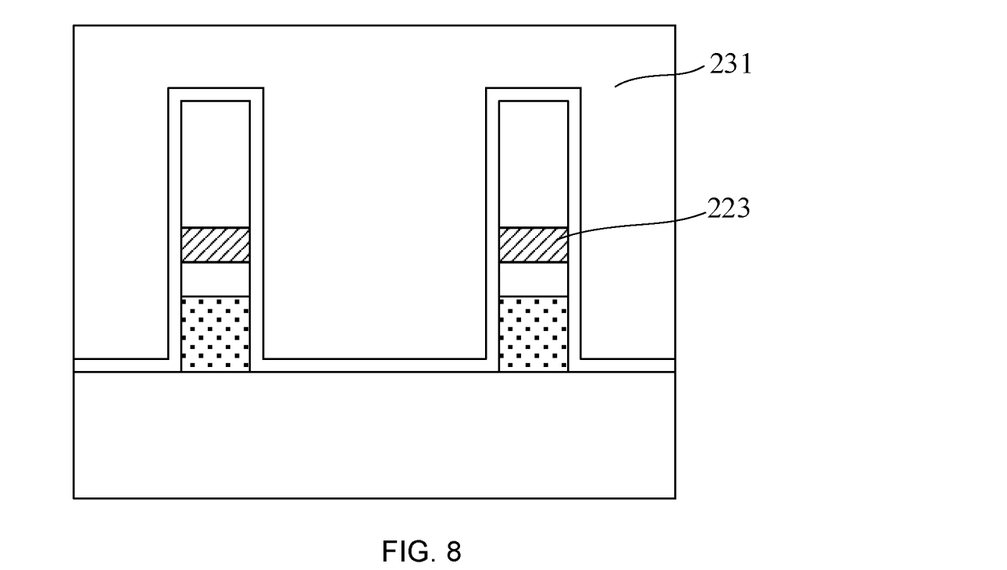
FIG. 8 is a first schematic cross-sectional structure diagrams diagram corresponding to steps a step of the method for manufacturing a semiconductor structure according to another embodiment of the present disclosure.

Referring to FIG. 8, the material for the initial isolation film 231 comprises silicon. There is a high etching selectivity between silicon and common dielectric materials (such as silicon nitride), which is beneficial to improve the etching accuracy of the etching process. In addition, silicon may be oxidized to generate silicon dioxide. The dielectric constant of silicon dioxide is about 3.9, which is less than the dielectric constant of silicon nitride, which is a common dielectric material (the dielectric constant of silicon nitride is about 7). In this way, it is helpful to improve the isolation effect between the adjacent metal layers 223 and decrease the parasitic capacitance between the adjacent bit line structures (not shown).

Wherein, silicon comprises monocrystalline silicon or polycrystalline silicon.

Figure 9:
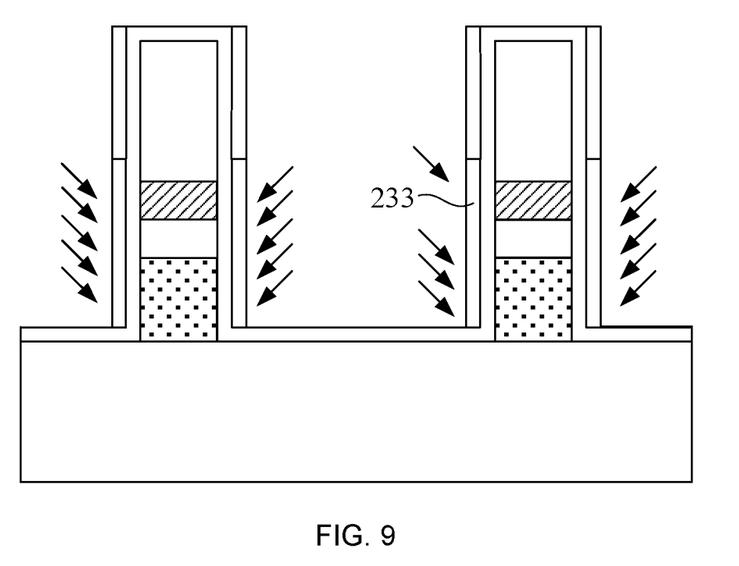
FIG. 9 is a second schematic cross-sectional structure diagram corresponding to a step of the method for manufacturing a semiconductor structure according to another embodiment of the present disclosure.

Referring to FIG. 9, after forming the first isolation layer 233, the first isolation layer 233 is subjected to a wet oxygen oxidation process. The silicon dioxide formed by the wet oxygen oxidation process will have tiny pores inside. The dielectric constant of air in the pores is about 1, which is much less than the dielectric constant of silicon dioxide. In this way, it is helpful to improve the isolation effect of the first isolation layer 233.

In other embodiments, the first isolation layer is oxidized by a dry oxygen oxidation process.

In this embodiment, by forming the initial isolation film 231 made of silicon in advance, the etching selectivity between the first isolation film and the first dielectric film is increased, thereby improving the etching accuracy of the etching process and ensuring the dimensional accuracy of the first isolation layer.

Correspondingly, an embodiment of the present disclosure further provides a semiconductor structure which can be manufactured by any of the above-mentioned methods.

Referring to FIG. 7, in this embodiment, the semiconductor structure comprises: a substrate 11 and a plurality of discrete bit line structures 12 located on the substrate 11, the bit line structure 12 having a metal layer 123 therein, the top surface of the metal layer 123 being lower than the top surface of the bit line structure 12; a first isolation layer 133, located on sidewalls of the bit line structure 12, the top surface of the first isolation layer 133 being higher than the top surface of the metal layer 123 and lower than the top surface of the bit line structure 12; and a first dielectric layer 142, located on sidewalls of the bit line structure 12 and exactly above the first isolation layer 133.

The semiconductor structure of the present disclosure will be described in detail below with reference to the accompanying drawings.

In this embodiment, the dielectric constant of the material for the first isolation layer 133 is less than the dielectric constant of the material for the first dielectric layer 142. In this way, it is helpful to improve the isolation effect of the first isolation layer 133.

In this embodiment, the material for the first isolation layer 133 comprises silicon dioxide, and the dielectric constant of silicon dioxide is about 3.9; and the material for the first dielectric layer 142 comprises silicon nitride, and the dielectric constant of silicon nitride is about 7.

In this embodiment, the semiconductor structure further comprises: a second dielectric layer 15 located on a sidewall of the first isolation layer 133 exposed by the first dielectric layer 142, the hardness of the material for the second dielectric layer 15 being greater than the hardness of the material for the first isolation layer 133.

In this embodiment, the first dielectric layer 142 may serve as a mask for the first isolation layer 133, which is helpful to improve the thickness accuracy of the first isolation layer 133, thereby improving the isolation effect of the first isolation layer 133.

It may be understood by a person of ordinary skill in the art that the above-mentioned implementations are specific embodiments for realizing the present disclosure, and in actual applications, various changes may be made to the form and details without departing from the spirit and scope of the present disclosure. Those skilled in the art can make their own changes and modifications without departing from the spirit and scope of the present disclosure. Therefore, the protection scope of the present disclosure shall be subject to the scope defined by the claims.

What is claimed is:

1. A method for manufacturing a semiconductor structure, comprising:

providing a substrate and a plurality of discrete bit line structures located on the substrate, each bit line structure having a metal layer therein, a top surface of the metal layer being lower than a top surface of the bit line structure;

forming a first isolation film filled between adjacent bit line structures of the bit line structures, a top surface of the first isolation film being higher than the top surface of the metal layer and lower than the top surface of the bit line structure;

forming a first dielectric film on tops and sidewalls of the bit line structures and on the top surface of the first isolation film;

etching to remove the first dielectric film on the tops of the bit line structures and the top surface of the first isolation film by a maskless dry etching process to form a first dielectric layer, and etching to remove the first isolation film exposed by the first dielectric layer to form a first isolation layer exactly below the first dielectric layer; and wherein a material for the first isolation layer comprises silicon; and after forming the first isolation layer, the first isolation layer is oxidized by the wet oxygen oxidation process to generate silicon dioxide with tiny pores inside.

2. The method according to claim 1, wherein a dielectric constant of a material for the first isolation layer is less than a dielectric constant of a material for the first dielectric layer.

3. The method according to claim 2, wherein the material for the first isolation layer comprises silicon dioxide; and precursor gas forming the first isolation layer comprises ethyl silicate and ozone.

4. The method according to claim 3, wherein the first isolation film is formed by a chemical vapor deposition process; and the first dielectric film is formed by an atomic layer deposition process.

5. The method according to claim 1, after said forming the first isolation layer, the method further comprises: forming a second dielectric layer on a sidewall of the first isolation layer exposed by the first dielectric layer, a hardness of a material for the second dielectric layer being greater than a hardness of the material for the first isolation layer.

6. The method according to claim 1, wherein said forming the first isolation layer and the first dielectric layer comprises: forming the first dielectric layer by a first maskless dry etching process, an etching rate for the first dielectric film being greater than an etching rate for the first isolation film by the first maskless dry etching process; and forming the first isolation layer by a second maskless dry etching process, the etching rate for the first isolation film being greater than the etching rate for the first dielectric film by the second maskless dry etching process.

7. The method according to claim 6, wherein the first isolation film comprises first regions being located on the sidewalls of the bit line structures and having a preset thickness, and second regions located between the first regions; and before the second maskless dry etching process, an ion doping process is performed on the first regions or the second regions, and the ion doping process is used to make the etching rate for the second regions greater than the etching rate for the first regions.

8. The method according to claim 6, wherein the forming a first isolation film filled between the adjacent bit line structures comprises: forming an initial isolation film completely filled between the adjacent bit line structures; performing a flattening process so that a top surface of the initial isolation film is flush with the top surface of the bit line structure; and etching to remove part of a thickness of the initial isolation film to form the first isolation film.

9. The method according to claim 1, wherein a difference in height between the top surface of the first isolation film and the top surface of the bit line structure is 50 nm to 100 nm.

* * * * *